United States Patent
Brauchler et al.

(10) Patent No.: US 9,466,413 B2
(45) Date of Patent: *Oct. 11, 2016

(54) DIE-TO-DIE INDUCTIVE COMMUNICATION DEVICES AND METHODS

(71) Applicants: Fred T. Brauchler, Canton, MI (US);
John M. Pigott, Phoenix, AZ (US);
Darrel R. Frear, Phoenix, AZ (US);
Vivek Gupta, Phoenix, AZ (US);
Randall C. Gray, Tempe, AZ (US);
Norman L. Owens, Sun Lakes, AZ (US); Carl E. D'Acosta, Mesa, AZ (US)

(72) Inventors: Fred T. Brauchler, Canton, MI (US);
John M. Pigott, Phoenix, AZ (US);
Darrel R. Frear, Phoenix, AZ (US);
Vivek Gupta, Phoenix, AZ (US);
Randall C. Gray, Tempe, AZ (US);
Norman L. Owens, Sun Lakes, AZ (US); Carl E. D'Acosta, Mesa, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 477 days.

This patent is subject to a terminal disclaimer.

(21) Appl. No.: 13/930,236

(22) Filed: Jun. 28, 2013

(65) Prior Publication Data
US 2015/0001948 A1    Jan. 1, 2015

(51) Int. Cl.
*H01L 25/00* (2006.01)
*H01L 25/065* (2006.01)
*H02J 5/00* (2016.01)
(Continued)

(52) U.S. Cl.
CPC ......... *H01F 19/08* (2013.01); *H01L 23/49575* (2013.01); *H01L 23/5227* (2013.01); *H01L 23/645* (2013.01); *H01F 2019/085* (2013.01); *H01L 2224/0401* (2013.01); *H01L 2224/04042* (2013.01); *H01L 2224/131* (2013.01); *H01L 2224/16245* (2013.01); *H01L 2224/32145* (2013.01); *H01L 2224/48247* (2013.01); *H01L 2224/48464* (2013.01);
(Continued)

(58) Field of Classification Search
None
See application file for complete search history.

(56) References Cited

U.S. PATENT DOCUMENTS 4,780,795 A    10/1988   Meinel
6,054,780 A     4/2000   Haigh et al.
(Continued)

FOREIGN PATENT DOCUMENTS

EP    2509106 A1    10/2012
WO    2010137090 A1   12/2010

OTHER PUBLICATIONS

Canegallo, R. et al, "3D Contactless Communication for IC Design," IEEE International Conference on Integrated Circuit Design and Technology and Tutorial; Jun. 2-4, 2008; ISBN 978-1-4244-1810-7; pp. 241-244.
(Continued)

*Primary Examiner* — Jared Fureman
*Assistant Examiner* — Aqeel Bukhari
(74) *Attorney, Agent, or Firm* — Sherry W. Schumm

(57) ABSTRACT

Embodiments of inductive communication devices include first and second galvanically isolated IC die and a dielectric structure. Each IC die has a coil proximate to a first surface of the IC die. The IC die are arranged so that the first surfaces of the IC die face each other, and the first coil and the second coil are aligned across a gap between the first and second IC die. The dielectric structure is positioned within the gap directly between the first and second coils, and a plurality of conductive structures are positioned in or on the dielectric structure and electrically coupled with the second IC die. The conductive structures include portions configured to function as bond pads, and the bond pads may be coupled to package leads using wirebonds. During operation, signals are conveyed between the IC die through inductive coupling between the coils.

15 Claims, 9 Drawing Sheets

(51) Int. Cl.
*H01F 19/08* (2006.01)
*H01L 23/522* (2006.01)
*H01L 23/64* (2006.01)
*H01L 23/495* (2006.01)

(52) U.S. Cl.
CPC ............... *H01L 2224/73215* (2013.01); *H01L 2924/13055* (2013.01); *H01L 2924/14* (2013.01)

(56) References Cited

U.S. PATENT DOCUMENTS

| | | | |
|---|---|---|---|
| 6,873,065 | B2 | 3/2005 | Haigh et al. |
| 7,112,457 | B2 | 9/2006 | Kek et al. |
| 7,582,960 | B2 | 9/2009 | Karnezos |
| 7,692,444 | B2 | 4/2010 | Chen et al. |
| 7,709,944 | B2 | 5/2010 | Kuan et al. |
| 8,203,214 | B2 | 6/2012 | Bathan et al. |
| 8,237,534 | B2 | 8/2012 | Fouquet et al. |
| 8,427,844 | B2 | 4/2013 | Ho et al. |
| 8,571,360 | B2 | 10/2013 | Tay et al. |
| 8,592,944 | B2 | 11/2013 | Santangelo et al. |
| 8,674,800 | B2 | 3/2014 | Willkofer et al. |
| 2010/0148911 | A1* | 6/2010 | Fouquet ............... H01F 27/2804 336/200 |
| 2010/0328902 | A1 | 12/2010 | Ho et al. |
| 2011/0001587 | A1 | 1/2011 | Sutardja |
| 2011/0049693 | A1* | 3/2011 | Nakashiba ............... H01L 23/48 257/676 |
| 2011/0176339 | A1 | 7/2011 | Kerber et al. |
| 2014/0070420 | A1 | 3/2014 | Sapone |

OTHER PUBLICATIONS

European Search Report mailed Oct. 29, 2014, for EP 14173336, 7 pages.
Wayne, S., "iCoupler Digital Isolators Protect RS-232, RS-485, and CAN Buses in Industrial, Instrumentation, and Computer Applications", Analog Dialogue 39-10, http://www.analog.com/analogdialogue, Oct. 2005, pp. 1-4.
Krakauer, D., "Anatomy of a Digital Isolator", Analog Devices, Technical Article MS-2234, www.analog.com, Oct. 2011, pp. 1-3.
Chen, B., "iCoupler Products with isoPower Technology: Signal and Power Transfer Across Isolation Barrier Using Microtransformers", Analog Devices, www.analog.com, Apr. 2006, pp. 1-4.
Avago Technologies, "ACPL-M71U and ACPL-M72U, Wide Operating Temperature, High Speed, Low Power Digital Optocouplers with R2Coupler Isolation", Data Sheet, www.avagotech.com, Oct. 5, 2012, pp. 1-11.
Non-Final Rejection mailed Jul. 22, 2015 for U.S. Appl. No. 13/930,250, 22 pages.
Notice of Allowance mailed May 22, 2015 for U.S. Appl. No. 14/104,355, 11 pages.
Notice of Allowance mailed Jul. 22, 2015 for U.S. Appl. No. 14/573,674, 9 pages.
Final Rejection mailed Nov. 5, 2015 for U.S. Appl. No. 13/930,250, 18 pages.
Non-Final Rejection mailed Sep. 29, 2015 for U.S. Appl. No. 14/812,242, 5 pages.
Notice of Allowance mailed Aug. 20, 2015 for U.S. Appl. No. 14/573,674, 9 pages.
Requirement for Restriction/Election mailed Jun. 30, 2016 for U.S. Appl. No. 14/225,764, 7 pages.

* cited by examiner

DIE-TO-DIE INDUCTIVE COMMUNICATION DEVICES AND METHODS

TECHNICAL FIELD

Embodiments relate generally to inductive communication circuits, systems, and methods.

BACKGROUND

In a variety of applications, electrical (or galvanic) isolation is desired between distinct circuits while enabling communication between those circuits. "Galvanic isolation" means that there is no metallic or electrically conductive path between the distinct circuits. For example, galvanic isolation may be desired to protect a first circuit that operates at a relatively low supply voltage from a second circuit that operates at a relatively high supply voltage difference from the first circuit. In addition, galvanic isolation may be desired to isolate a first circuit tied to a first voltage reference (e.g., ground) from a second circuit tied to a different voltage reference (e.g., a floating voltage reference). Galvanic isolation also may be desired to prevent extraneous transient signals produced by one circuit from being conveyed to and processed by another circuit as valid signals or data.

A specific application that may benefit from galvanic isolation may be found within an automotive hybrid electric vehicle (HEV) system, for example. In an HEV system, a circuit that includes an insulated gate bipolar transistor (IGBT) array and corresponding gate drivers (referred to as an "IGBT circuit") may be used to rectify AC power, and to provide the resulting DC power to a high voltage battery (e.g., 300 volts (V) or more). A grounded control circuit (e.g., including a microcontroller) operating at a significantly lower vehicle chassis voltage (e.g., 12 V) may be used to provide control signals to the gate drivers. In order to isolate the control circuit from switching noise from the IGBT circuit, it may be desirable to provide complete galvanic isolation between the control circuit and the IGBT circuit.

In other systems, for safety reasons, it may be desirable to isolate equipment that is connected to an AC power line from conductive portions of the equipment that users can touch. In such systems, an isolation circuit may be used to mitigate the likelihood of shocks, burns, and/or electrocution from current flowing through a human body to ground.

Conventional techniques for providing electrical isolation include the use of optical isolators, capacitive isolators, transformer-based isolators, and so on. However, these techniques may be non-optimal or unsuitable for some applications, in that they may be expensive, require a large amount of space, consume significant power, and/or have some other characteristics that may reduce their desirability for a given application.

DETAILED DESCRIPTION

As will be described in more detail below, embodiments described herein include inductive communication devices that may be incorporated into systems in which galvanic isolation between circuits is desired. As will be described in more detail later, embodiments of inductive communication devices include at least two IC die, each of which includes at least one conductive coil, arranged so that their respective corresponding coils are each aligned with each other across a gap. One or more dielectric components (including a physical dielectric structure) may be positioned within the gap, where the dielectric component(s) have properties that provide a desired level of galvanic isolation between the coils. Essentially, the two IC die and the dielectric component(s) form a stack. Bond pads at a surface of one of the IC die and bond pads at a surface of the dielectric structure are electrically coupled (e.g., using wirebonds, solder bumps, stud bumps, direct chip attach structures, and/or other types of electrical connections) to distinct package leads. Other bond pads at the surface of the dielectric structure are electrically coupled to other bond pads at a surface of the other IC die. According to an embodiment, the IC die also may include communication circuitry (e.g., transmitter, receiver, and/or transceiver circuitry) coupled to the coils, where the communication circuitry converts input signals from communication signals that are conductive into inductive communication signals, and after the communication signals have been inductively communicated, converts the communication signals into an approximation of the input signals. According to an embodiment, the first and second IC die and the intervening dielectric component(s) all are packaged within a single integrated circuit package.

Figure 1:
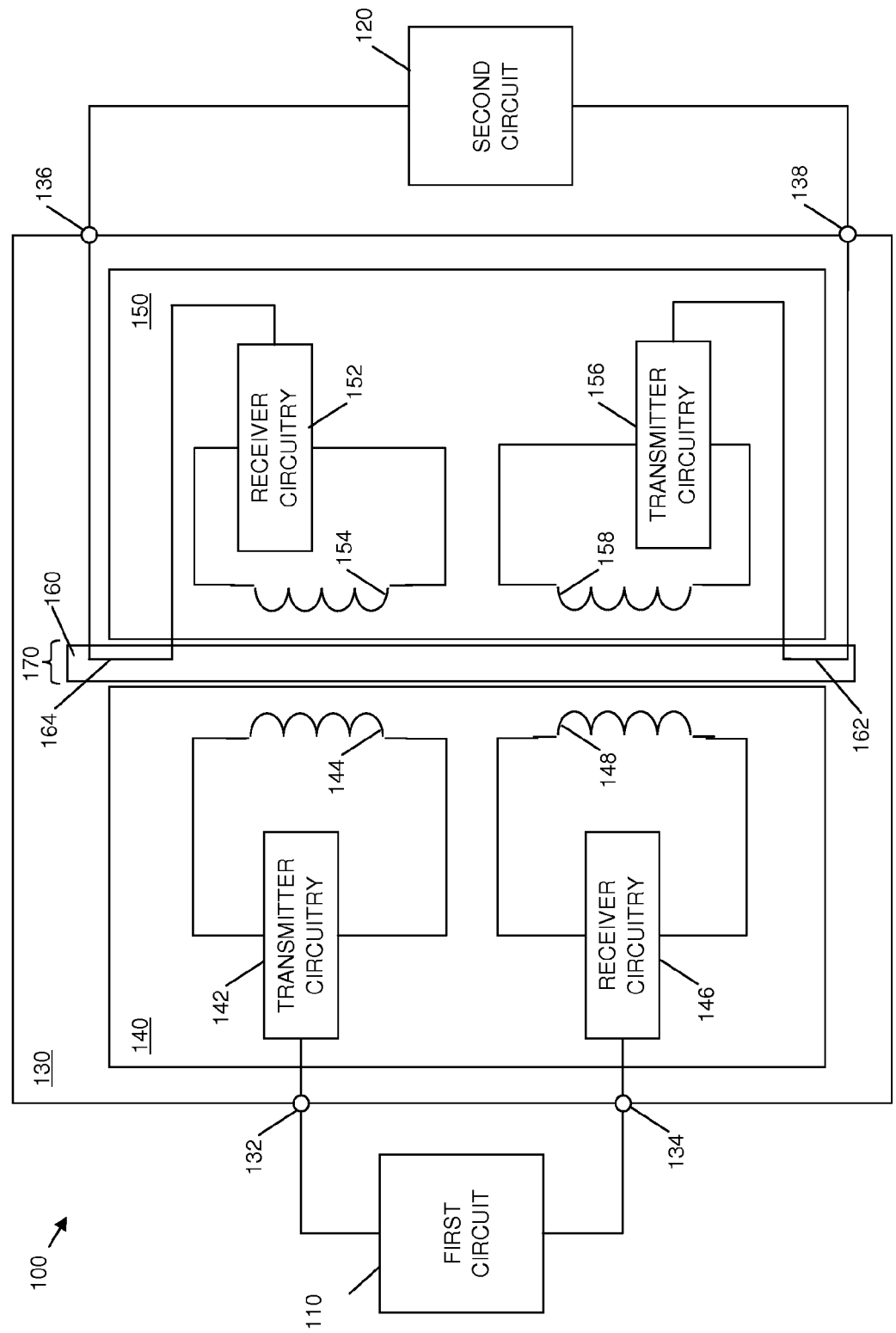
FIG. 1 is a simplified, circuit diagram illustrating a system that includes an inductive communication device that provides galvanic isolation between first and second circuits, according to an example embodiment.

FIG. 1 is a simplified, circuit diagram illustrating a system 100 that includes an inductive communication device 130 that provides galvanic isolation between first and second circuits 110, 120, according to an example embodiment. Accordingly, inductive communication device 130 alternatively may be referred to as a "galvanic isolation device." In system 100, the first circuit 110 may operate at a relatively low supply voltage, and the second circuit 120 may operate at a voltage difference from circuit 110, although circuits 110, 120 may operate without a voltage difference, as well. In addition or alternatively, the first circuit 110 may be tied to a first voltage reference point (e.g., ground) and the second circuit 200 may tied to a different voltage reference point (e.g., a floating voltage level), although circuits 110, 120 may be tied to the same voltage reference point, as well. System 100 may, for example, form a portion of a battery charging system for an HEV (e.g., the first circuit 110 may include a control circuit, and the second circuit 120 may include an array of IGBTs and associated gate drivers), a portion of an AC power isolation system, or may form a portion of another type of system in which galvanic isolation between first and second circuits is desired.

The various components of inductive communication device 130 are packaged in a single package (e.g., an air-cavity package or overmolded package), in an embodiment. These components include a first integrated circuit (IC) die 140, a second IC die 150, and one or more dielectric components (including dielectric structure 160) positioned between the first and second IC die 140, 150. As used herein, a "dielectric component" may be an air gap or a physical structure that includes dielectric material (e.g., a layer of dielectric material or another type of structure that includes dielectric material). As will be better illustrated in the Figures that follow, the first and second IC die 140, 150 are physically arranged with respect to each other to provide inductive communication between the first and second IC die 140, 150 across a gap 170, which includes the dielectric structure 160. In some embodiments, the dielectric structure 160 may substantially fill the gap 170 between the surfaces of the first and second IC die 140, 150. In other embodiments, one or more air gaps may be present within the gap 170 (i.e., the gap 170 may not be completely filled by the dielectric structure 160).

In the embodiment depicted in FIG. 1, the inductive communication device 130 supports bi-directional communication between the circuits 110, 120. More specifically, along a forward communication path between the first circuit 110 and the second circuit 120, the inductive communication device 130 includes first transmitter circuitry 142 and a first (primary) coil 144 within the first IC die 140, and a second (secondary) coil 154 and first receiver circuitry 152 within the second IC die 150. Along a reverse communication path between the second circuit 120 and the first circuit 110, the inductive communication device 130 includes second transmitter circuitry 156 and a third (primary) coil 158 within the second IC die 150, and a fourth (secondary) coil 148 and second receiver circuitry 146 within the first IC die 140. The first and second IC die 140, 150 also may include tuning capacitors (not illustrated) configured to enhance the resonance between primary/secondary coil pairs.

Figure 6:
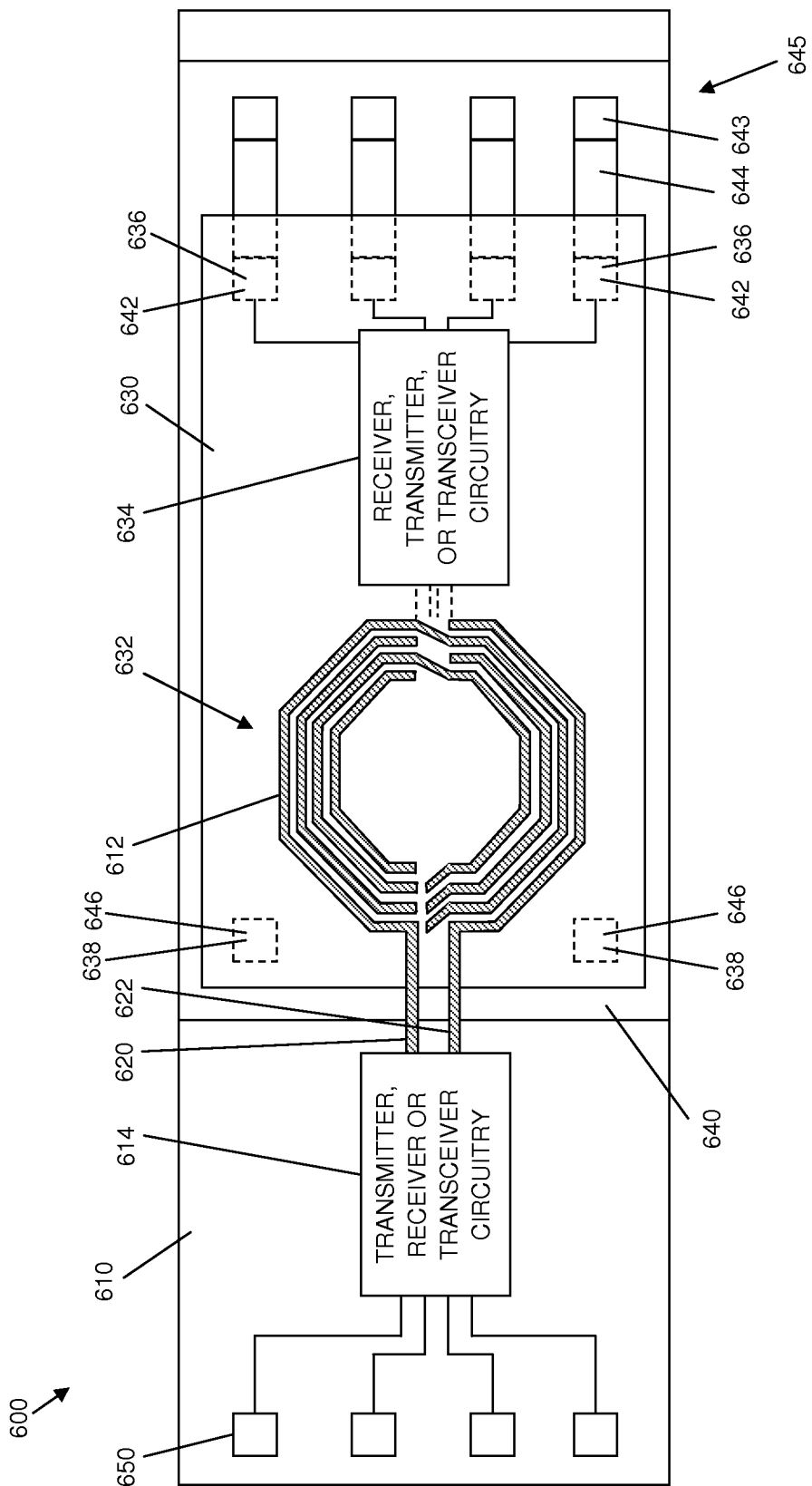
FIG. 6 is a top view of a portion of an inductive communication device, according to an example embodiment.
Figure 7:
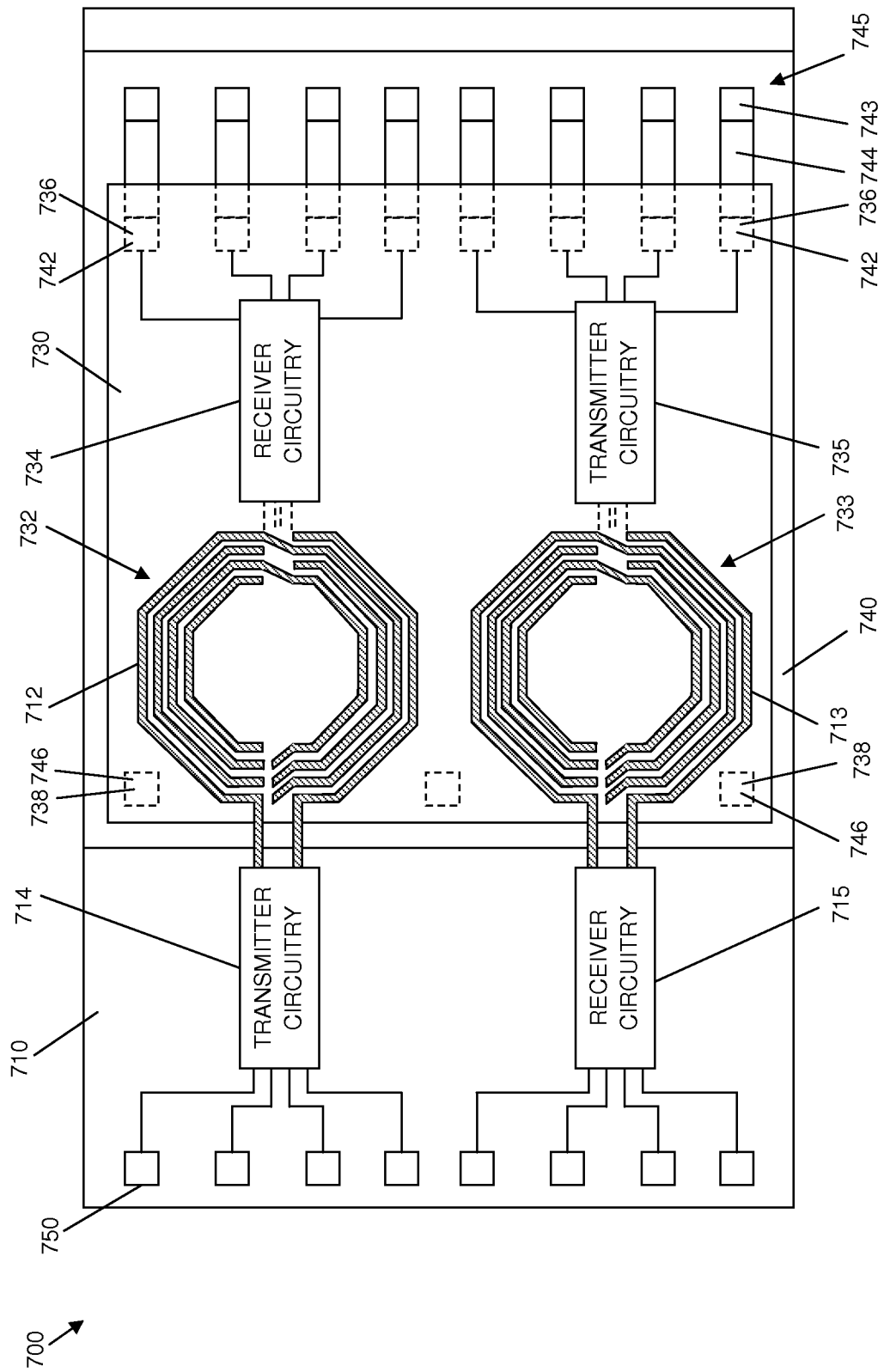
FIG. 7 is a top view of a portion of an inductive communication device, according to another example embodiment.

Although inductive communication device 130 is shown to provide one forward communication path and one reverse communication path, other embodiments of inductive communication devices may provide only one communication path (i.e., only one forward or reverse communication path, such as is depicted in FIG. 6), or multiple communication paths in a particular direction (e.g., multiple forward and/or reverse communication paths, such as is depicted in FIG. 7). Alternatively, one or more of the communication paths may be bi-directional, and each IC die 140, 150 may include transceiver circuitry, rather than transmitter or receiver circuitry. In such an embodiment, communication in a forward or reverse direction may be conducted in a time-duplexed manner, and each of coils 144, 148, 154, 158 may alternate between functioning as a primary coil and a secondary coil. In addition, communication may be conducted in a full duplex manner, in which communication may be conducted simultaneously in a forward and reverse direction between a primary and a secondary coil. Although transceiver-type embodiments are not discussed extensively below, it is to be understood that such embodiments fall within the scope of the inventive subject matter.

In still other alternate embodiments, the transmitter circuitry, receiver circuitry, or transceiver circuitry may be formed on a separate IC from its associated coil. In such embodiments, the IC that includes the coil and the IC that includes the corresponding communication circuitry may both be included within a single packaged device, or may be in distinctly packaged devices.

During operation, transmitter circuitry 142, 156 receives an input signal via input nodes 132, 138, respectively. Transmitter circuitry 142, 156 then converts the input signal into a form that is appropriate for inductive communication by primary coils 144, 158, respectively. More specifically, in an embodiment, each transmitter circuitry 142, 156 provides a time-varying (e.g., oscillating) drive signal (e.g., an alternating current in the form of a sinusoidal wave, a square wave, or another wave pattern) to the primary coil 144, 158 to which it is coupled. The primary coils 144, 158 convert the drive signal into a time-varying magnetic field or flux around the primary coils 144, 158, referred to herein as the "communication signal." The time-varying magnetic field or flux generated by each primary coil 144, 158 extends across the gap 170 through the dielectric structure 160 (and other dielectric components, if they are present within the gap 170) and couples with the corresponding secondary coil 148, 154. More specifically, the communication signal is transmitted from each primary coil 144, 158 to each secondary coil 154, 148 through magnetic inductive coupling between the primary/secondary coil pairs. In response to the communication signal coupling with each secondary coil 148, 154, the secondary coil 148, 154 produces an alternating waveform or voltage, which is received by the receiver circuitry 146, 152 to which each secondary coil 148, 154 is coupled. The receiver circuitry 146, 152 then converts the signal received from the secondary coil 148, 154, respectively, into a reconstructed version of the input signal, and the reconstructed version of the input signal is provided at output nodes 134, 136, respectively, to the first and second circuitry 110, 120.

As depicted in FIG. 1, according to an embodiment, a portion 162 of the electrical connection between input node 138 and the transmitter circuitry 156 on the second IC die 150 is physically located in or on dielectric structure 160. Similarly, a portion 164 of the electrical connection between output node 136 and the receiver circuitry 152 on the second IC die 150 is physically located in or on dielectric structure 160. As will be explained in more detail later, positioning portions 162, 164 of the electrical connections in or on dielectric structure 160 enables wirebonds or other types of electrical connections more easily to be coupled within the device 130 to the device's leads (e.g., leads 284, FIG. 2).

First transmitter circuitry 142 is coupled between an output of first circuit 110 and primary coil 144, and second transmitter circuitry 156 is coupled between an output of second circuit 120 and primary coil 158, in an embodiment. According to an embodiment, each transmitter circuitry 142, 156 includes an oscillator (not illustrated) and driver circuit (not illustrated) configured to provide the time-varying drive signal to the primary coil 144, 158 to which it is coupled. For example, the driver circuit may receive an input signal from first circuit 110 (e.g., an information-carrying square wave), and may convert the input signal into an alternating signal having characteristics that are conducive to inductive communication between the primary/secondary coil pairs. According to an embodiment, for example, the driver circuit may implement amplitude-shift keying (ASK) modulation to represent the digital data conveyed in an input signal. More specifically, for example, the driver circuit may implement on-off keying (OOK), in which the driver circuit produces a carrier wave at a frequency established by the oscillator when the input signal has a relatively high logic level (e.g., indicating a binary one), and refrains from producing the carrier wave when the input signal has a relatively low logic level (e.g., indicating a binary zero). In alternate embodiments, the driver circuit may implement other modulation techniques (e.g., frequency modulation, phase modulation or other techniques). According to an embodiment, the carrier wave conveyed within the drive signal may have a frequency in a band of between about 200 megahertz (MHz) and about 400 MHz (e.g., 300 MHz), although the carrier wave may have higher or lower frequencies in other bands, as well.

First receiver circuitry 152 is coupled between secondary coil 154 and an input to second circuit 120, and second receiver circuitry 146 is coupled between secondary coil 148 and an input to first circuit 110. According to an embodiment, each receiver circuitry 146, 152 includes an amplifier, a detector (not illustrated) and other circuitry configured to convert the time-varying communication signal received from the secondary coil 154, 148 to which it is coupled into a reconstructed version of the signal that was input into the corresponding transmitter circuitry 142, 156 along each communication path.

The dielectric structure 160 (and other dielectric components, if present in the gap 170) is positioned between each primary/secondary coil pair (i.e., between first and second coils 144, 154 and between third and fourth coils 148, 158). Although a single dielectric structure 160 is illustrated, distinct dielectric structures may be used, in other embodiments (e.g., one dielectric structure for each primary/secondary coil pair), or the dielectric structure 160 may be composed of distinct layers with different dielectric properties. In addition, as mentioned previously, other dielectric components may be present within the gap 170. The dielectric structure 160 (and other dielectric components, if present within the gap 170) provides DC isolation (galvanic isolation) between the first IC die 140 and the second IC die 150, and thus between the first circuit 110 and the second circuit 120. The level of DC isolation provided is affected by the combined thickness of the dielectric structure 160 and any other dielectric components within the gap 170 (or the width of the gap 170 that is established by the dielectric structure 160 and other dielectric components, if present) and the dielectric constant(s) of the dielectric structure 160 and any other dielectric components within the gap 170. For example, the dielectric structure 160 and other dielectric components, if present, may be configured to provide DC isolation in a range of about 1.0 kilovolts (kV) to about 4.0 kV, or more desirably from about 2.0 kV to about 5.0 kV, although dielectric structure 160 and other dielectric components, if present, may be configured to provide more or less DC isolation, as well.

Figure 2:
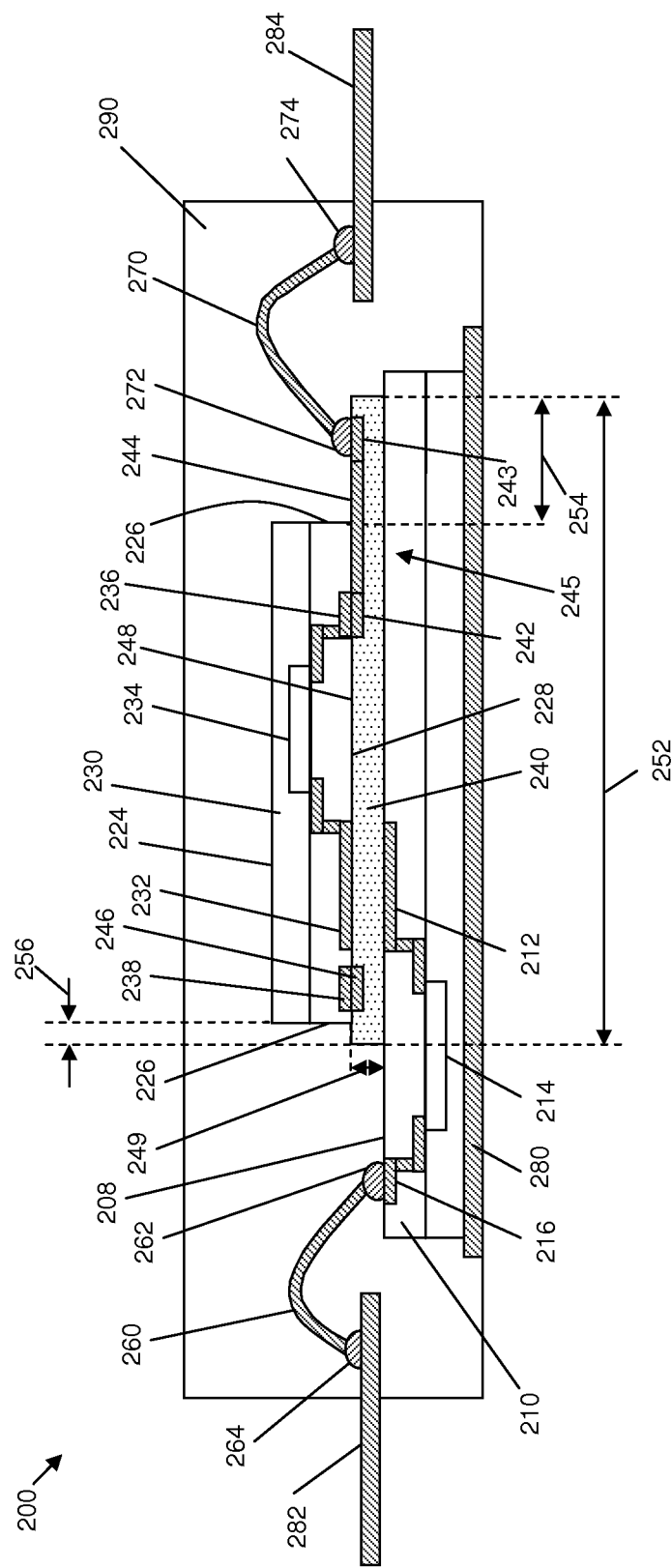
FIG. 2 is a cross-sectional, side view of an inductive communication device, according to an example embodiment.

Various embodiments of an inductive communication device (e.g., device 130) and configurations of IC die and interposed dielectric structures (e.g., configurations of IC die 140, 150 and dielectric structure 160) will now be described in more detail. For example, FIG. 2 is a cross-sectional, side view of an inductive communication device 200 (e.g., inductive communication device 130, FIG. 1), according to an example embodiment. Inductive communication device 200 includes a first IC die 210, a second IC die 230, a dielectric structure 240 positioned between the first and second IC die 210, 230, a plurality of conductive structures 242, 243, 244, 246 located in or on a surface of the dielectric structure 240, a plurality of leads 282, 284, and a plurality of wirebonds 260, 270, in an embodiment. In alternate embodiments, either or both sets of wirebonds 260, 270 may be replaced by other types of electrical connections (e.g., solder bumps, stud bumps, and/or direct chip attach structures). In addition, inductive communication device 200 may include a support structure 280 and encapsulation 290. More particularly, in the embodiment depicted in FIG. 2, the electrical components of inductive communication device 200 of FIG. 2 are housed in an overmolded package (i.e., a package in which the electrical components are substantially encased in a non-conductive (e.g., plastic) encapsulant material). As mentioned previously, embodiments of inductive communication devices alternatively may include electrical components housed in an air-cavity package (i.e., a package in which the electrical components are located within an air cavity within the package, where the air cavity is typically sealed with a lid).

First IC die 210 includes at least one coil 212 (e.g., a primary coil 144, 158 or secondary coil 148, 154, FIG. 1), at least one instantiation of communication circuitry (e.g., transmitter circuitry 142, 156, receiver circuitry 146, 152, FIG. 1, or transceiver circuitry), a plurality of bond pads 216, and various conductive traces and vias interconnecting the coil(s) 212, communication circuitry 214, and bond pads 216. In an alternate embodiment, as mentioned previously, the communication circuitry 214 may be included in a separate die within the same package as the die that contains the coil 212, or the communication circuitry 214 may be separately packaged. In any of the above-described embodiments, the bond pads 216 may be considered to be electrically coupled to the coil 212 (e.g., either directly or indirectly through communication circuitry 214).

Similarly, second IC die 230 includes at least one coil 232 (e.g., a primary coil 144, 158 or secondary coil 148, 154, FIG. 1), at least one instantiation of communication circuitry 234, a plurality of bond pads 236, and various conductive traces and vias interconnecting the coil(s) 232, communication circuitry 234, and bond pads 236. According to an embodiment, second IC die 230 also includes one or more additional bond pads 238, which provide for mechanical coupling to the dielectric structure 240, as will be described in more detail later. As was the case with the first IC die 210, in an alternate embodiment, the communication circuitry 234 may be included in a separate die within the same package as the die that contains the coil 232, or the communication circuitry 234 may be separately packaged. In whichever embodiment, the bond pads 236 may be considered to be electrically coupled to the coil 232 (e.g., either directly or indirectly through communication circuitry 234).

One of coils 212, 232 may function as a primary coil, and the other of coils 212, 232 may function as a secondary coil, or both coils 212, 232 may function as a primary and a secondary coil at alternating times (e.g., in a transceiver-type embodiment). Either way, coils 212, 232 each are proximate to a surface 208, 228 of the IC die 210, 230 in which they are included. As used herein, the term "proximate to a surface," when referring to the position of a coil means that a portion of the coil is either exposed at the surface, or that one or more non-conductive layers of material (e.g., oxide layers) is disposed over the coil, where the surface of the non-conductive layers of material establishes the surface of the IC.

In any event, the surfaces 208, 228 of the first and second IC die 210, 230 to which the coils 212, 232 are proximate are arranged to face each other within device 200 so that the coils 212, 232 are aligned with each other across a gap that is established by the dielectric structure 240. The alignment of the coils 212, 232 across the gap enables inductive communication to occur between the coils 212, 232.

Dielectric structure 240 is positioned within the gap directly between the coils 212, 232, and may extend laterally beyond the coils 212, 232. According to an embodiment, a thickness 249 of the dielectric structure 240 substantially equals the width of the gap between the coils 212, 232. Accordingly, the level of galvanic isolation between the coils 212, 232 (and thus the IC die 210, 230) is directly related to the thickness 249 of the dielectric structure 240 and the material(s) from which the dielectric structure 240 is formed. In other embodiments, other dielectric components may be present within the gap between the coils 212, 232, as well. According to an embodiment, dielectric structure 240 may have a thickness 249 in a range of about 20 micrometers (μ) to about 400 μ, or more desirably from about 100 μ about 200 μ, although dielectric structure 240 may be thinner or thicker, as well. According to a further embodiment, the first IC die 210 is wider than the second IC die 230, and the dielectric structure 240 has a width 252, which is sufficient to allow the dielectric structure 240 to extend beyond the edges 226 of the second IC die 230 by distances 254, 256. In other words, the dielectric structure 240 may extend beyond the lateral extent of the second IC die 230. This extension of the dielectric structure 240 beyond the edges 226 of the IC die 230 may result in a reduction in fringing effects, including arcing or shorting, that may be present near the edges 226. In addition, extension of the dielectric structure 240 beyond the lateral extend of the second IC die 230 enables a bond pad 243 to be included at a surface 248 of the dielectric structure 240, as will be explained in more detail below. In an alternate embodiment, the second IC die 230 may be wider than the first IC die 210, and the dielectric structure 240 may extend beyond the edges of the first IC die 210.

According to an embodiment, a plurality of conductive structures 245 are formed in or on dielectric structure 240 (e.g., on or exposed at a surface 248 of dielectric structure 240). Each conductive structure 245 may include, for example, a first bond pad 242 that is electrically coupled with a corresponding bond pad 236 of the second IC die 230, a second bond pad 243, and a conductive trace 244 that electrically couples the first and second bond pads 242, 243. Although bond pads 242, 243 and conductive trace 244 are depicted as separate elements in the Figures, the bond pads 242, 243 and conductive trace 244 may be integrally formed. For example, the bond pads 242, 243 and conductive trace 244 may be formed from a single conductive feature that is printed or otherwise formed (e.g., using additive or subtractive trace formation methods) on the surface of the dielectric structure 240. In alternate embodiments, the plurality of conductive structures 245 may include portions that are embedded within the dielectric structure 240, rather than being formed entirely on the surface 248 of the dielectric structure 240.

According to an embodiment, and as mentioned above, each first bond pad 242 is electrically coupled to a corresponding bond pad 236 of the second IC die 230, and each second bond pad 243 may be electrically coupled to a package lead 284 (e.g., using a wirebond 270). Accordingly, the conductive structure 245 provides for electrical connectivity between the second IC die 230 and package lead 284. According to an embodiment, an additional bond pad 246 also may be formed on or exposed at the surface 248 of the dielectric structure 240. The additional bond pad 246 may be coupled with a corresponding bond pad 238 of the second IC die 230, thus providing for enhanced physical attachment of the second IC die 230 and the dielectric structure 240.

Support structure 280 and leads 282, 284 may form portions of a leadframe, in an embodiment. In the illustrated embodiment, the support structure 280 and leads 282, 284 are not co-planar. Accordingly, the support structure 280 essentially coincides with a bottom surface of device 200, and leads 282, 284 extend from the sides of device 200 at locations that are between the bottom and top surfaces of the device 200. In alternate embodiments, the support structure 280 and leads 282, 284 may be co-planar. In such embodiments, the leads either may extend outward from the bottom of the device 200, or the leads may terminate at the sides of the device 200 (e.g., in flat no-leads types of packages).

In the embodiment illustrated in FIG. 2, the first IC die 210 is coupled to support structure 280, the dielectric structure 240 is positioned on surface 208 of the first IC die 210, and surface 228 of the second IC die 230 is coupled to the top surface 248 of dielectric structure 240. Portions of the surfaces 208, 228 of the first and second IC die 210, 230 overlap each other to allow the coils 212, 232 to be aligned with each other. The bond pads 216 of the first IC die 210 are coupled to leads 282 extending from a first side of the device 200 via wirebonds 260. More particularly, a first end 262 of each wirebond 260 is coupled to a bond pad 216 of first IC die 210, and a second end 264 of each wirebond 260 is coupled to a lead 282. According to an embodiment, the bond pads 243 of the conductive structures 245 are coupled to leads 284 extending from a second side of the device 200 via wirebonds 270. More particularly, a first end 272 of each wirebond 270 is coupled to a bond pad 243 proximate to surface 248 of dielectric structure 240, and a second end 274 of each wirebond 270 is coupled to a lead 284. According to an embodiment, conductive structures 245 and bond pads 243 are positioned to enable the wirebonds 270 to extend from the top surface 248 of the dielectric structure 240 to the top surface of lead 284. As mentioned previously, either or both sets of wirebonds 260, 270 may be replaced by other types of electrical connections (e.g., solder bumps, stud bumps, and/or direct chip attach structures). Leads 282, 284 may correspond to an input node and an output node (e.g., one of leads 282, 284 may correspond to one of input nodes 132, 138, and the other one of leads 282, 284 may correspond to one of output nodes 134, 136, FIG. 1).

The cross-sectional view illustrated in FIG. 2 depicts a single communication path between leads 282, 284. For example, the direction of the communication path may be from lead 282 to lead 284. In such a case, communication circuitry 214 of the first IC die 210 may be transmitter circuitry (e.g., transmitter circuitry 142 or 156, FIG. 1), and the coil 212 of the first IC die 210 may be a primary coil (e.g., primary coil 144 or 158, FIG. 1). Conversely, communication circuitry 234 of the second IC die 230 may be receiver circuitry (e.g., receiver circuitry 146 or 152, FIG. 1), and the coil 232 of the second IC die 230 may be a secondary coil (e.g., secondary coil 148 or 154, FIG. 1). Alternatively, the direction of the communication path may be from lead 284 to lead 282. In this case, communication circuitry 234 of the second IC die 230 may be transmitter circuitry (e.g., transmitter circuitry 142 or 156, FIG. 1), and the coil 232 of the second IC die 230 may be a primary coil (e.g., primary coil 144 or 158, FIG. 1). Conversely, communication circuitry 214 of the first IC die 210 may be receiver circuitry (e.g., receiver circuitry 146 or 152, FIG. 1), and the coil 212 of the first IC die 210 may be a secondary coil (e.g., secondary coil 148 or 154, FIG. 1). Alternatively, communication circuitry 214, 234 may be transceiver circuitry, which may function as both transmitter circuitry and receiver circuitry in a time-duplexed manner. In such an embodiment, each of coils 212, 232 may alternate between functioning as a primary coil and a secondary coil. Although only a single communication path is depicted in FIG. 2, inductive communication device 200 also may include one or more additional communication paths in the same direction and/or the opposite direction as the communication path depicted in FIG. 2.

In the embodiments depicted in FIGS. 2-4 and 6-8, various relative orientations of coils, communication circuitry, and bond pads are conveyed. More particularly, in each of the embodiments depicted in FIGS. 2-4 and 6-8, the coils, communication circuitry, and bond pads are shown to be positioned in spatially separated portions of the respective IC die. It should be understood that, in alternate embodiments, the communication circuitry and bond pads of an IC die may be positioned in any suitable position with respect to the coil(s) of that IC die. For example, but not by way of limitation, all or portions of the communication circuitry may be placed below and/or in the center of a coil. Any suitable relative orientation of coils, communication circuitry, and bond pads is intended to be included within the scope of the inventive subject matter.

Figure 3:
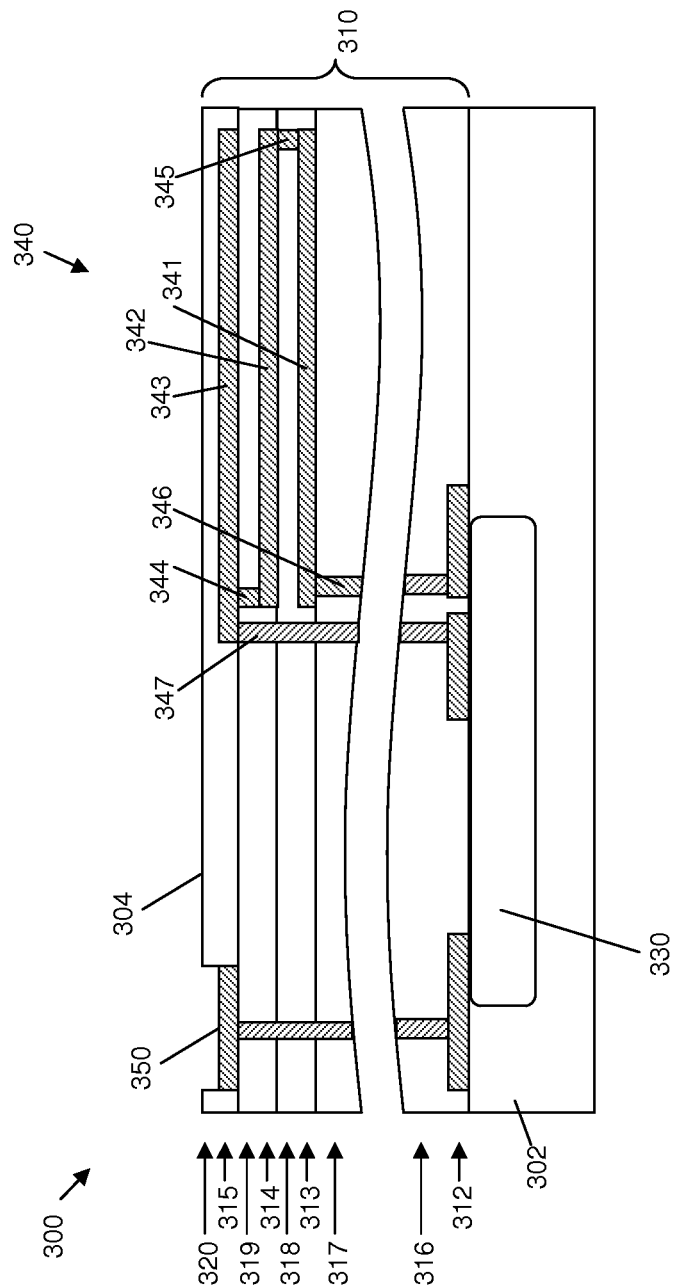
FIG. 3 is a cross-sectional, side view of a first integrated circuit die that may be used in an inductive communication device, according to an example embodiment.

More detailed examples of embodiments of IC die (e.g., IC die 210 and 230) will now be described. More particularly, FIG. 3 is a cross-sectional, side view of a first IC die 300 (e.g., IC die 210, FIG. 2) that may be used in an inductive communication device (e.g., inductive communication device 130 or 200, FIGS. 1, 2), according to an example embodiment. IC die 300 includes a semiconductor substrate 302, and a build-up structure 310 comprising a plurality of conductive layers 312, 313, 314, 315 and dielectric layers 316, 317, 318, 319, 320 on a top surface of the semiconductor substrate 302. For consistency with FIG. 2 and enhanced understanding, IC die 300 is shown in the same orientation as IC die 210 of FIG. 2 (i.e., with the surface 304 to which coil 340 is proximate facing upward).

Various active components forming communication circuitry 330 are formed in the semiconductor substrate 302. For example, the communication circuitry 330 may be transmitter circuitry (e.g., transmitter circuitry 142 or 156, FIGS. 1, 2), receiver circuitry (e.g., receiver circuitry 146 or 152, FIGS. 1, 2) or transceiver circuitry, in various embodiments. The components of the communication circuitry 330 are interconnected through conductive traces formed in some or all of the conductive layers 312-315 and conductive vias formed through dielectric layers between the conductive layers 312-315. One or more bond pads 350 may be formed in an uppermost conductive layer 315, and the bond pads 350 may be electrically coupled to the communication circuitry 330 with conductive vias formed through the dielectric layers 316-319 and conductive traces formed between the vias in the conductive layers 312-315. When IC die 300 is incorporated into an inductive communication device (e.g., device 130, 200, FIGS. 1, 2), a wire bond (e.g., wirebond 260, FIG. 2) may be coupled between the bond pad 350 and a device lead (e.g., lead 282, FIG. 2). For example, bond pad 350 may correspond to a bond pad configured to receive a communication signal from external circuitry or to provide a communication signal to external circuitry (e.g., to bond pad 216, FIG. 2, corresponding to one of nodes 132, 134, 136, or 138, FIG. 1).

In addition, IC die 300 includes a coil 340 (e.g., one of coils 144, 148, 154, 158, 212, 232, FIGS. 1, 2), which includes multiple substantially-concentric conductive rings 341, 342, 343 formed in one or more uppermost conductive layers 313-315 (i.e., formed proximate to surface 304 of IC die 300). For example, in the embodiment illustrated in FIG. 3, coil 340 includes conductive rings formed in the uppermost three conductive layers 313-315. The conductive rings in the various layers 313-315 are interconnected through conductive vias 344, 345 to form a continuous conductive coil having first and second ends that are electrically coupled to the communication circuitry 330. For example, a first end of the coil 340 may be coupled to the communication circuitry 330 through conductive via 346 and other conductive structures (not illustrated) between the coil 340 and the communication circuitry 330, and a second end of the coil 340 may be coupled to the communication circuitry 330 through conductive via 347 and still other conductive structures (not illustrated) between the coil 340 and the communication circuitry 330. In other embodiments, coil 340 may be formed using fewer or more than three conductive layers, and/or the ends of coil 340 may be located on a same conductive layer. In addition, vias 344, 345 shown interconnecting the concentric conductive rings 341-343 may be located in other positions, and/or multiple vias may be used to provide a plurality of cross-overs used to construct the continuous coil 340.

The uppermost dielectric layer 320 may or may not overlie the coil 340, in various embodiments. In an embodiment in which the uppermost dielectric layer 320 does overlie the coil 340 (e.g., the embodiment illustrated in FIG. 3), the height of the portion of the uppermost dielectric layer 320 overlying the coil 340 contributes to the thickness of the gap (e.g., thickness 249 of the gap, FIG. 2) between the IC die 300 and a second IC die (e.g., IC die 400, FIG. 4) that is positioned over the IC die 300. In addition, the portion of the uppermost dielectric layer 320 overlying the coil 340 may contribute to the overall level of galvanic isolation between IC 300 and the other IC die, when arranged according to the embodiments discussed herein.

Figure 4:
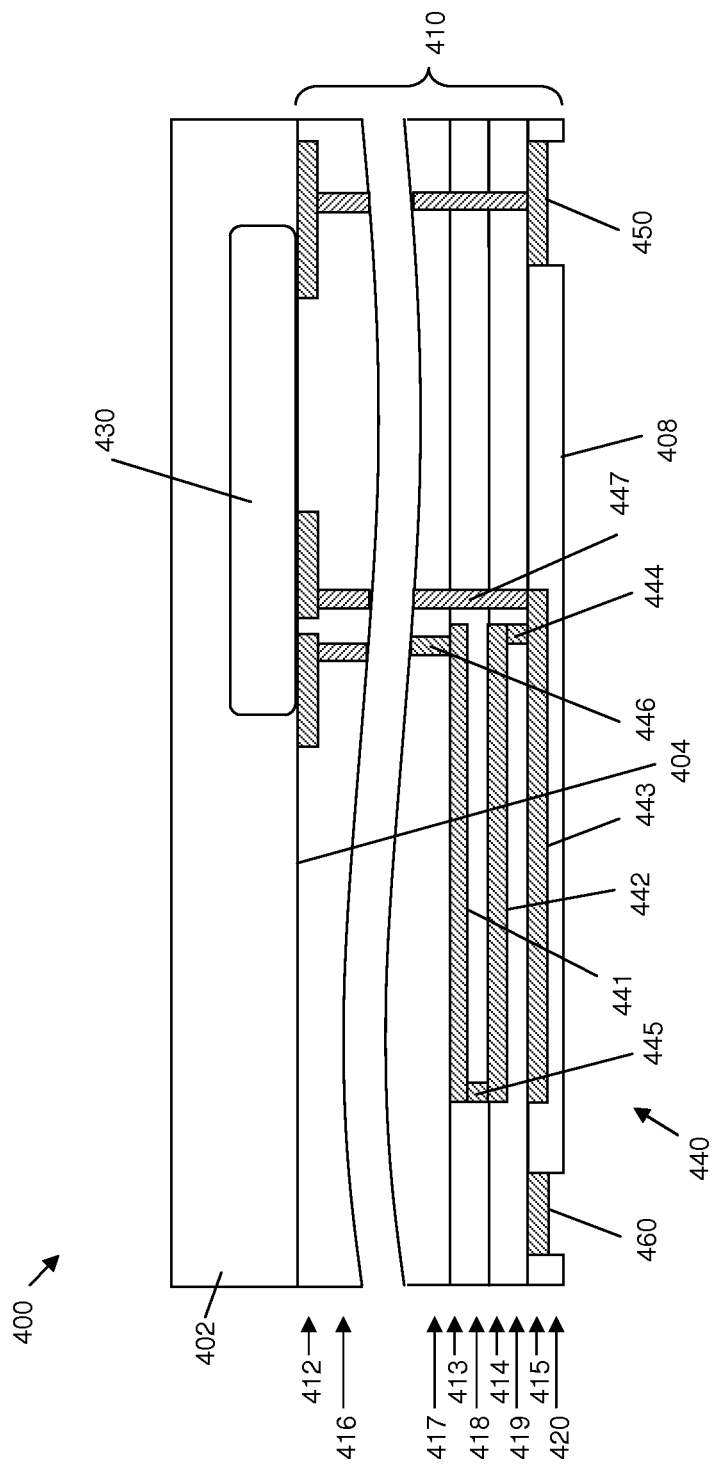
FIG. 4 is a cross-sectional, side view of a second integrated circuit die that may be used in an inductive communication device, according to an example embodiment.

FIG. 4 is a cross-sectional, side view of a second IC die 400 (e.g., IC die 230, FIG. 2) that may be used in an inductive communication device (e.g., inductive communication device 130 or 200, FIGS. 1, 2), according to an example embodiment. IC die 400 includes a semiconductor substrate 402, and a build-up structure 410 comprising a plurality of conductive layers 412, 413, 414, 415 and dielectric layers 416, 417, 418, 419, 420 formed over a first surface 404 of the semiconductor substrate 402. For consistency with FIG. 2 and enhanced understanding, IC die 400 is shown in the same orientation as IC die 230 of FIG. 2 (i.e., with the surface 408 of IC die 400 to which coil 440 is proximate facing downward).

Various active components forming communication circuitry 430 are formed in the semiconductor substrate 402. For example, the communication circuitry 430 may be transmitter circuitry (e.g., transmitter circuitry 142 or 156, FIGS. 1, 2), receiver circuitry (e.g., receiver circuitry 146 or 152, FIGS. 1, 2) or transceiver circuitry, in various embodiments. The components of the communication circuitry 430 are interconnected through conductive traces formed in some or all of the conductive layers 412-415 and conductive vias formed between the conductive layers 412-415. One or more bond pads 450 may be formed in an uppermost conductive layer 415, and the bond pads 450 may be electrically coupled to the communication circuitry 430 with conductive vias formed through the dielectric layers 416-419 and conductive traces formed between the vias in the conductive layers 412-415. When IC die 400 is incorporated into an inductive communication device (e.g., device 130, 200, FIGS. 1, 2), the bond pads 450 may be coupled to corresponding bond pads (e.g., bond pads 242, FIG. 2) on or exposed at a surface of a dielectric structure (e.g., dielectric structure 240, FIG. 2). For example, bond pad 450 may correspond to a bond pad configured to receive a communication signal from external circuitry or to provide a communication signal to external circuitry (e.g., to bond pad 236, FIG. 2, corresponding to one of nodes 132, 134, 136, or 138, FIG. 1). According to an embodiment, IC die 400 also may include one or more additional bond pads 460, which may be coupled to corresponding bond pads (e.g., bond pads 246, FIG. 2) exposed at a surface of a dielectric structure (e.g., dielectric structure 240, FIG. 2) to provide for enhanced mechanical coupling between the IC die 400 and the dielectric structure.

In addition, IC die 400 includes a coil 440 (e.g., one of coils 144, 148, 154, 158, 212, 232, FIGS. 1, 2), which includes multiple substantially-concentric conductive rings 441, 442, 443 formed in one or more uppermost conductive layers 413-415 (i.e., formed proximate to surface 408 of IC die 400). For example, in the embodiment illustrated in FIG. 4, coil 440 includes conductive rings formed in the uppermost three conductive layers 413-415. The conductive rings in the various layers 413-415 are interconnected through conductive vias 444, 445 to form a continuous conductive coil having a first and second ends that are electrically coupled to the communication circuitry 430. For example, a first end of the coil 440 may be coupled to the communication circuitry 430 through conductive via 446 and other conductive structures (not illustrated) between the coil 440 and the communication circuitry 430, and a second end of the coil 440 may be coupled to the communication circuitry 430 through conductive via 447 and still other conductive structures (not illustrated) between the coil 440 and the communication circuitry 430. In other embodiments, coil 440 may be formed using fewer or more than three conductive layers, and/or the ends of coil 440 may be located on a same conductive layer. In addition, vias 444, 445 shown interconnecting the concentric conductive rings 441-443 may be located in other positions, and/or multiple vias may be used to provide a plurality of cross-overs used to construct the continuous coil 440.

The uppermost dielectric layer 420 may or may not overlie the coil 440, in various embodiments. In an embodiment in which the uppermost dielectric layer 420 does overlie the coil 440 (e.g., the embodiment illustrated in FIG. 4), the height of the portion of the uppermost dielectric layer 420 overlying the coil 440 contributes to the thickness of the gap (e.g., thickness 249 of the gap, FIG. 2) between the IC die 400 and another IC die (e.g., IC die 300, FIG. 3) that is positioned under the IC die 400. In addition, the portion of the uppermost dielectric layer 420 overlying the coil 440 may contribute to the overall level of galvanic isolation between IC 400 and the other IC die, when arranged according to the embodiments discussed herein.

Figure 5:
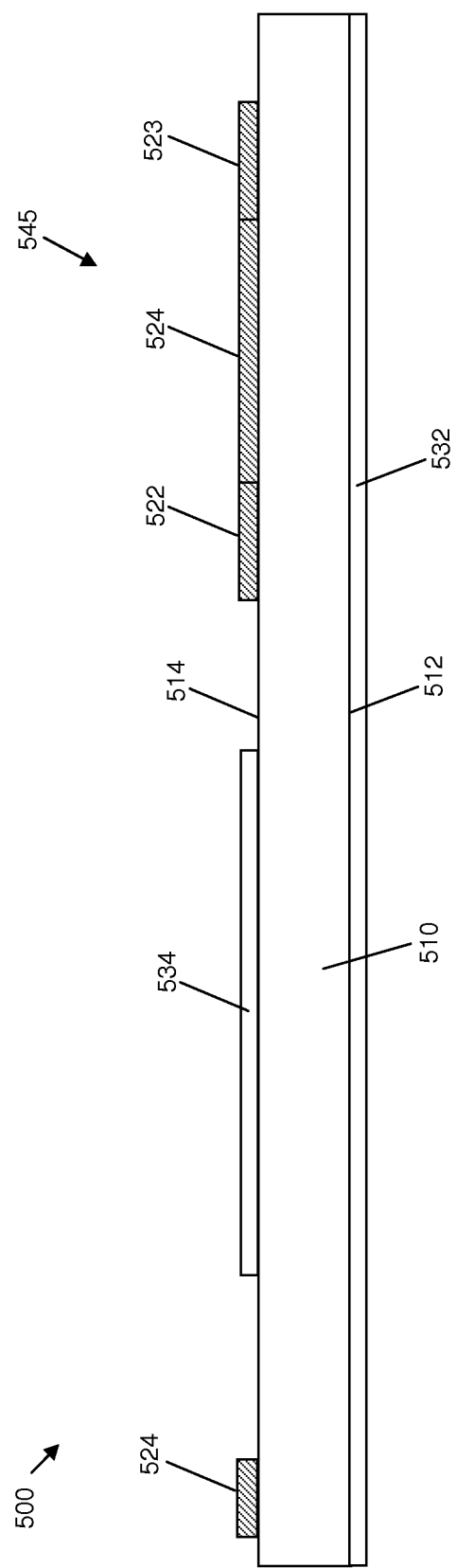
FIG. 5 is a cross-sectional, side view of a dielectric structure that may be used in an inductive communication device, according to an example embodiment.

FIG. 5 is a cross-sectional, side view of a dielectric structure 500 (e.g., dielectric structure 240, FIG. 2) that may be used in an inductive communication device (e.g., inductive communication device 130 or 200, FIGS. 1, 2), according to an example embodiment. Dielectric structure 500 includes a main body 510 having a first surface 512 and an opposing second surface 514. According to an embodiment, main body 510 may have a dielectric constant in a range of about 2.0 to about 5.0, although main body 510 may have a lower or higher dielectric constant, as well. According to an embodiment, main body 510 includes a material selected from polyimide, polytetrafluorethylene, benzocyclobutene, or other materials with a suitable dielectric constant.

Main body 510 may be formed from a single layer of material, or main body 510 may be formed from multiple layers of a single material or multiple materials, in various embodiments. In addition, main body 510 may be formed as a single component, as illustrated in FIG. 5, or main body 510 may be formed as multiple, physically distinct components. For example, in one embodiment, main body 510 may be a single component that extends under an entirety of the coils (e.g., coils 212, 232, FIG. 2) of two IC die (e.g., IC die 210, 230, FIG. 2) and that also extends beyond the lateral extent of at least one of the IC die (e.g., second IC die 230, FIG. 2) to facilitate formation of the conductive structures 545 in or on the main body 510. In an alternate embodiment, main body 510 may include a first component that is positioned directly between the coils (e.g., coils 212, 232, FIG. 2) and a second, physically distinct component in or on which the conductive structures 545 are formed.

Either way, when incorporated into an inductive communication device (e.g., inductive communication device 200, FIG. 2), the first surface 512 of the main body 510 faces a first IC die (e.g., IC die 210, 300, FIGS. 2, 3), and the second surface 514 faces a second IC die (e.g., IC die 230, 400, FIGS. 2, 4). To enhance the mechanical coupling between the dielectric structure 500 and the first and second IC die, dielectric structure 500 also may include adhesive layers 532, 534 covering all or portions of the first and/or second surfaces 512, 514 of the main body 510 (e.g., the dielectric structure 500 may be configured as a tape). In addition, one or more bond pads 524 may be positioned on or proximate to (e.g., exposed at) the second surface 514 of the main body 510. As discussed previously, such bond pads 524 may be coupled to corresponding bond pads (e.g., bond pads 238, 460, FIGS. 2, 4) of the second IC die (e.g., IC die 230, 400, FIGS. 2, 4) to enhance the mechanical coupling between the dielectric structure 500 and the second IC die.

According to an embodiment, a plurality of conductive structures 545 (e.g., conductive structures 245, FIG. 2) are formed on or proximate to the second surface 514 of the main body 510. As discussed previously, each conductive structure 545 may include a first bond pad 522, a second bond pad 523, and a conductive trace 524 that electrically couples the first and second bond pads 522, 523. When the dielectric structure 500 is incorporated into an inductive communication device (e.g., inductive communication device 200, FIG. 2), the first bond pad 522 may be electrically coupled with a corresponding bond pad (e.g., bond pad 236, 450, FIGS. 2, 4) of a second IC die (e.g., IC die 230, 400, FIGS. 2, 4), and the second bond pad 523 may be electrically coupled to a package lead (e.g., package lead 284, FIG. 2). For example, the second bond pad 523 may be electrically coupled to a package lead using a wirebond (e.g., wirebond 270, FIG. 2).

As also discussed previously, the bond pads 522, 523 and conductive trace 524 may be formed from a single conductive feature that is printed or otherwise formed (e.g., using additive or subtractive trace formation methods) on the surface of the main body 510. In alternate embodiments, the plurality of conductive structures 545 may include portions that are embedded within the main body 510, rather than being formed entirely on the surface 514 of the main body 510.

Figure 8:
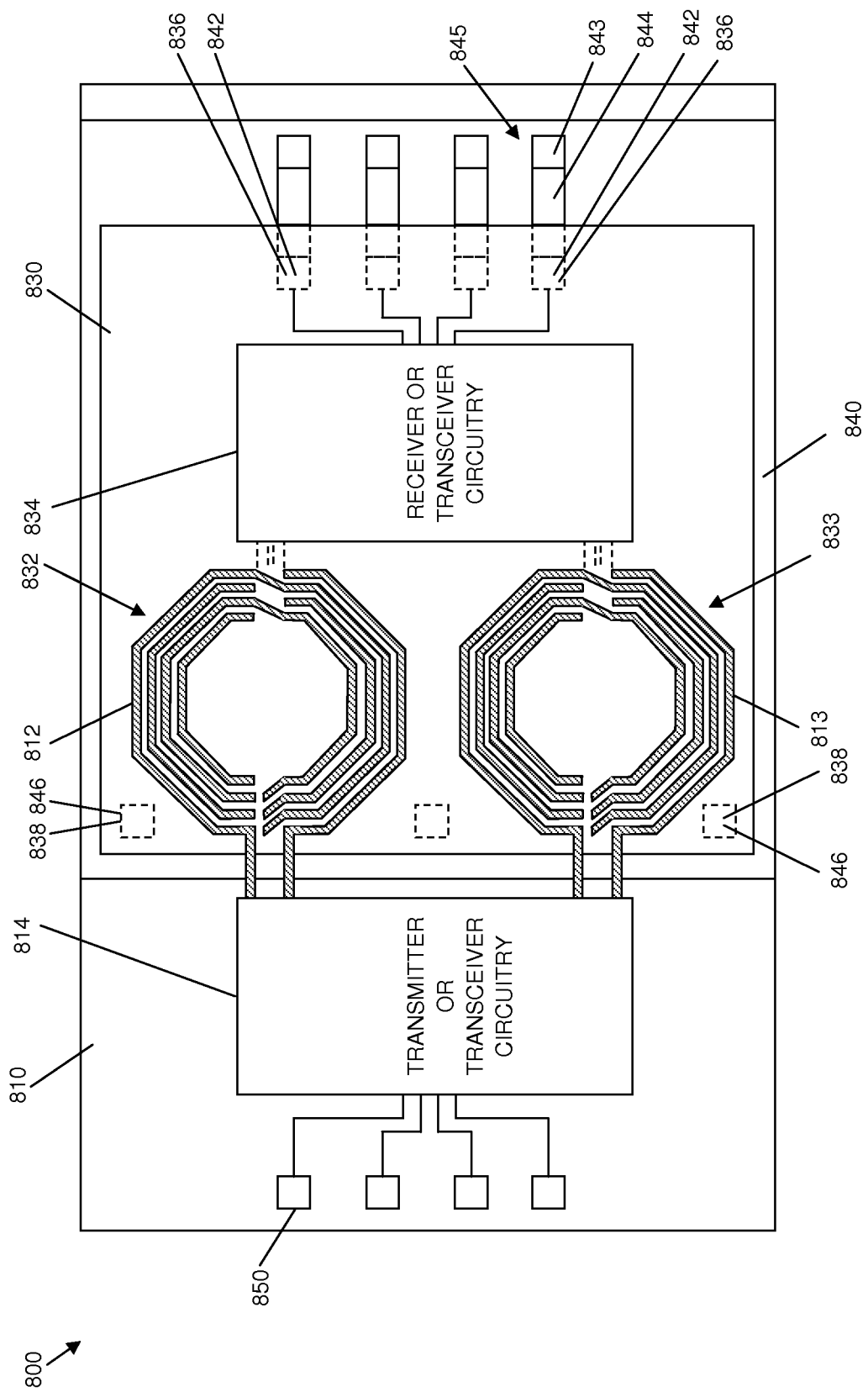
FIG. 8 is a top view of a portion of an inductive communication device, according to yet another example embodiment.

Various embodiments of arrangements of different types of IC die within an inductive communication device will now be described in conjunction with FIGS. 6-8. More particularly, FIGS. 6-8 depict embodiments that include a single communication path that includes a single primary/secondary coil pair (FIG. 6), multiple parallel communication paths, each of which includes a single primary/secondary coil pair (FIG. 7), and a single communication path that includes multiple primary/secondary coil pairs (FIG. 8).

FIG. 6 is a top view of a portion of an inductive communication device 600 with a single communication path that includes a single primary/secondary coil pair 612, 632, according to an example embodiment. More particularly, FIG. 6 illustrates the top surface of a first IC die 610, which includes a first coil 612 proximate to the top surface of the first IC die 610, first communication circuitry 614 (e.g., transmitter, receiver, or transceiver circuitry), and a plurality of first bond pads 650 proximate to the top surface of the first IC die 610. Coil 612 consists of a continuous conductive structure (i.e., continuous between an input terminal 620 and an output terminal 622) that includes multiple substantially-concentric conductive rings that may be located in multiple conductive layers of the first IC die 610. In FIG. 6 (and also in FIGS. 7 and 8), coil 612 does not appear to consist of a continuous conductive structure between input terminal 620 and output terminal 622, as there are various apparent discontinuities shown within coil 612. The discontinuities are shown to simplify the depiction of coil 612, and also to indicate that the coil's concentric rings may be coupled through conductive vias to concentric rings in underlying conductive layers, further conveying that the structure of coil 612 may be a multi-layer structure that includes a plurality of cross-overs to establish a continuous conductive structure.

Also depicted in FIG. 6 is the top surface of a second IC die 630 overlying the first IC die 610. The second IC die 630 includes a second coil 632 (not specifically apparent as the second coil 632 is substantially aligned with and overlies the first coil 612), second communication circuitry 634, and a second plurality of bond pads 636 proximate to and exposed at the bottom surface of the second IC die 630. As discussed previously, the second plurality of bond pads 636 may be coupled with a corresponding plurality of third bond pads 642 of conductive structures 645 located in or on dielectric structure 640. In addition, the second IC die 630 may include additional bond pads 638 proximate to and exposed at the bottom surface of the second IC die 630. As also discussed previously, the additional bond pads 638 may be coupled with corresponding bond pads 646 located on dielectric structure 640. Although only two additional bond pads 638 and corresponding bond pads 646 are shown in FIG. 6, device 600 may include more or fewer additional and corresponding bond pads 638, 646.

Also depicted in FIG. 6 is the top surface of dielectric structure 640, which is partially obscured by second IC die 630. As discussed previously, when arranged to provide inductive communication between coils 612, 632 of the first and second IC die 610, 630, the surfaces of the first and second IC die 610, 630 to which the coils 612, 632 are proximate are oriented to face each other. In addition, the coils 612, 632 are substantially aligned with each other across a gap (e.g., gap 170, FIG. 1), which is established at least in part by the dielectric structure 640. As shown, the dielectric structure 640 is arranged so that it is present across the entire area of overlap of the coils 612, 632. According to a further embodiment, the dielectric structure 640 has dimensions such that the dielectric structure 640 extends beyond some or all of the edges of the second IC die 630.

According to an embodiment, a plurality of conductive structures 645 (e.g., conductive structures 245, FIG. 2) are formed on or proximate to the top surface of the dielectric structure 640. As discussed previously, each conductive structure 645 may include a third bond pad 642, a fourth bond pad 643, and a conductive trace 644 that electrically couples the third and fourth bond pads 642, 643.

In a complete inductive communication device (e.g., device 200, FIG. 2), some of first and fourth bond pads 650, 643 may be used to receive voltage supplies (e.g., power and ground), and other ones of first and fourth bond pads 650, 643 may be used to receive input signals, convey output signals, receive control signals, or convey other types of signals. Although each set of bond pads 636, 642, 643, 650 is shown to include four bond pads 636, 642, 643, 650, each IC 610, 630 and dielectric structure 640 may include more or fewer bond pads.

The embodiment depicted in FIG. 6 provides for a single one-way or bi-directional communication path. For example, when first communication circuitry 614 includes transmitter circuitry and second communication circuitry 634 includes receiver circuitry, a one-way communication path may be established from left to right in FIG. 6, or more specifically from first bond pads 650 through transmitter circuitry 614, first coil 612, second coil 632, receiver circuitry 634, second bond pads 636, third bond pads 642, conductive traces 644, and fourth bond pads 643. Conversely, when first communication circuitry 614 includes receiver circuitry and second communication circuitry 634 includes transmitter circuitry, a one-way communication path may be established from right to left in FIG. 6, or more specifically from fourth bond pads 643 through conductive traces 644, third bond pads 642, second bond pads 636, transmitter circuitry 634, second coil 632, first coil 612, receiver circuitry 614, and first bond pads 650. When first and second communication circuitry 614, 634 each include transceiver circuitry, a time-duplexed, bi-directional communication path may be established between the first and fourth bond pads 650, 643.

FIG. 7 is a top view of a portion of an inductive communication device 700 with two communications paths, each of which includes a single primary/secondary coil pair (i.e., coil pair 712, 732 and coil pair 713, 733), according to another example embodiment. Similar to the embodiment depicted in FIG. 6, FIG. 7 illustrates the top surface of a first IC die 710, a second IC die 730 overlying the first IC die 710, and a dielectric structure 740 positioned between surfaces of the first and second IC die 710, 730 to which coils 712, 713, 732, 733 are proximate.

The first IC die 710 includes first and second, spatially-separated coils 712, 713 proximate to the top surface of the first IC die 710, first transmitter circuitry 714, first receiver circuitry 715, and a plurality of first bond pads 750. The second IC die 730 includes third and fourth, spatially-separated coils 732, 733 (not specifically apparent as the third and fourth coils 732, 733 are substantially aligned with and overlie the first and second coils 712, 713, respectively), second receiver circuitry 734, second transmitter circuitry 735, and a second plurality of bond pads 736 proximate to and exposed at the bottom surface of the second IC die 730. As discussed previously, the second plurality of bond pads 736 may be coupled with a corresponding plurality of third bond pads 742 of conductive structures 745 located in or on dielectric structure 740. In addition, the second IC die 730 may include additional bond pads 738 proximate to and exposed at the bottom surface of the second IC die 730. As also discussed previously, the additional bond pads 738 may be coupled with corresponding bond pads 746 located on dielectric structure 740. Although only three additional bond pads 738 and corresponding bond pads 746 are shown in FIG. 7, device 700 may include more or fewer additional and corresponding bond pads 738, 746.

Also depicted in FIG. 7 is the top surface of dielectric structure 740, which is partially obscured by second IC die 730. As discussed previously, when arranged to provide inductive communication between coils 712, 713, 732, 733 of the first and second IC die 710, 730, the surfaces of the first and second IC die 710, 730 to which the coils 712, 713, 732, 733 are proximate are oriented to face each other. In addition, the coils 712, 713, 732, 733 are substantially aligned with each other across a gap (e.g., gap 170, FIG. 1), which is established at least in part by the dielectric structure 740. As shown, the dielectric structure 740 is arranged so that it is present across the entire area of overlap of the coils 712, 713, 732, 733. According to a further embodiment, the dielectric structure 740 has dimensions such that the dielectric structure 740 extends beyond some or all of the edges of the second IC die 730.

According to an embodiment, a plurality of conductive structures 745 (e.g., conductive structures 245, FIG. 2) are formed on or proximate to the top surface of the dielectric structure 740. As discussed previously, each conductive structure 745 may include a third bond pad 742, a fourth bond pad 743, and a conductive trace 744 that electrically couples the third and fourth bond pads 742, 743.

In a complete inductive communication device (e.g., device 200, FIG. 2), some of first and fourth bond pads 750, 743 may be used to receive voltage supplies (e.g., power and ground), and other ones of first and fourth bond pads 750, 743 may be used to receive input signals, convey output signals, receive control signals, or convey other types of signals. Although each set of bond pads 736, 742, 743, 750 is shown to include eight bond pads 736, 742, 743, 750, each IC 710, 730 and dielectric structure 740 may include more or fewer bond pads.

The embodiment depicted in FIG. 7 provides for two, one-way communication paths. More specifically, a first one-way communication path may be established from left to right in FIG. 7, or more specifically from first bond pads 750 through first transmitter circuitry 714, first coil 712, third coil 732, second receiver circuitry 734, second bond pads 736, third bond pads 742, conductive traces 744, and fourth bond pads 743. In addition, a second one-way communication path may be established from right to left in FIG. 7, or more specifically from fourth bond pads 743 through conductive traces 744, third bond pads 742, second bond pads 736, second transmitter circuitry 735, fourth coil 733, second coil 713, first receiver circuitry 715, and first bond pads 750. With the first and second communication paths being in opposite directions, the embodiment of FIG. 7 may essentially function as a transceiver.

FIG. 8 is a top view of a portion of an inductive communication device 800 with a single communications path, which includes two primary/secondary coil pairs (i.e., coil pair 812, 832 and coil pair 813, 833), according to yet another example embodiment. Similar to the embodiment depicted in FIGS. 6 and 7, FIG. 8 illustrates the top surface of a first IC die 810, a second IC die 830 overlying the first IC die 810, and a dielectric structure 840 positioned between surfaces of the first and second IC die 810, 830 to which coils 812, 813, 832, 833 are proximate.

The first IC die 810 includes first and second, spatially-separated coils 812, 813 proximate to the top surface of the first IC die 810, first communication circuitry 814 (e.g., transmitter circuitry, receiver circuitry, or transceiver circuitry), and a plurality of first bond pads 850. The second IC die 830 includes third and fourth, spatially-separated coils 832, 833 (not specifically apparent as the third and fourth coils 832, 833 are substantially aligned with and overlie the first and second coils 812, 813, respectively), second communication circuitry 834 (e.g., transmitter circuitry, receiver circuitry, or transceiver circuitry), and a second plurality of bond pads 836 proximate to and exposed at the bottom surface of the second IC die 830. As discussed previously, the second plurality of bond pads 836 may be coupled with a corresponding plurality of third bond pads 842 of conductive structures 845 located in or on dielectric structure 840. In addition, the second IC die 830 may include additional bond pads 838 proximate to and exposed at the bottom surface of the second IC die 830. As also discussed previously, the additional bond pads 838 may be coupled with corresponding bond pads 846 located on dielectric structure 840. Although only three additional bond pads 838 and corresponding bond pads 846 are shown in FIG. 8, device 800 may include more or fewer additional and corresponding bond pads 838, 846.

Also depicted in FIG. 8 is the top surface of dielectric structure 840, which is partially obscured by second IC die 830. As discussed previously, when arranged to provide inductive communication between coils 812, 813, 832, 833 of the first and second IC die 810, 830, the surfaces of the first and second IC die 810, 830 to which the coils 812, 813, 832, 833 are proximate are oriented to face each other. In addition, the coils 812, 813, 832, 833 are substantially aligned with each other across a gap (e.g., gap 170, FIG. 1), which is established at least in part by the dielectric structure 840. As shown, the dielectric structure 840 is arranged so that it is present across the entire area of overlap of the coils 812, 813, 832, 833. According to a further embodiment, the dielectric structure 840 has dimensions such that the dielectric structure 840 extends beyond some or all of the edges of the second IC die 830.

According to an embodiment, a plurality of conductive structures 845 (e.g., conductive structures 245, FIG. 2) are formed on or proximate to the top surface of the dielectric structure 840. As discussed previously, each conductive structure 845 may include a third bond pad 842, a fourth bond pad 843, and a conductive trace 844 that electrically couples the third and fourth bond pads 842, 843.

In a complete inductive communication device (e.g., device 200, FIG. 2), some of first and fourth bond pads 850, 843 may be used to receive voltage supplies (e.g., power and ground), and other ones of first and fourth bond pads 850, 843 may be used to receive input signals, convey output signals, receive control signals, or convey other types of signals. Although each set of bond pads 836, 842, 843, 850 is shown to include four bond pads 836, 842, 843, 850, each IC 810, 830 and dielectric structure 840 may include more or fewer bond pads.

The embodiment depicted in FIG. 8 provides for a single one-way or bi-directional communication path, where the communication signal is divided by the transmitter circuitry and provided to two primary coils in parallel. Two corresponding secondary coils receive the communication signal and provide it to receiver circuitry, which proceeds to re-combine and further process the signals. For example, when first communication circuitry 814 includes transmitter circuitry and second communication circuitry 834 includes receiver circuitry, a one-way communication path may be established from left to right in FIG. 8, or more specifically from first bond pads 850 through transmitter circuitry 814, in parallel through first and second (primary) coils 812, 813, again in parallel through third and fourth (secondary) coils 832, 833, receiver circuitry 834, second bond pads 836, third bond pads 842, conductive traces 844, and fourth bond pads 843. Conversely, when first communication circuitry 814 includes receiver circuitry and second communication circuitry 834 includes transmitter circuitry, a one-way communication path may be established from right to left in FIG. 8, or more specifically from fourth bond pads 843 through conductive traces 844, third bond pads 842, second bond pads 836, transmitter circuitry 834, in parallel through third and fourth (primary) coils 832, 833, in parallel through first and second (secondary) coils 812, 813, receiver circuitry 814, and first bond pads 850. When first and second communication circuitry 814, 834 each include transceiver circuitry, a time-duplexed, bi-directional communication path may be established between the first and fourth bond pads 850, 843, where the communication signal is split along the path and inductively communicated through the two primary/secondary coil pairs in parallel.

Each of the example embodiments illustrated in FIGS. 6-8 depict one or two communication paths, where each communication path provides for inductive communication using one or two primary/secondary coil pairs. Other embodiments may include multiple one-way communication paths in a particular direction (e.g., one IC die may include multiple instantiations of transmitter circuitry and corresponding primary coils and the other IC die may include the same number of instantiations of secondary coils and corresponding receiver circuitry). Still other embodiments may include multiple one-way communication paths in both directions (e.g., each IC die may include multiple instantiations of both transmitter and receiver circuitry and corresponding primary and secondary coils). Still other embodiments may include multiple bi-directional communication paths (e.g., each IC die may include multiple instantiations of transceiver circuitry and corresponding primary and secondary coils). Such embodiments are encompassed by the scope of the inventive subject matter.

In addition, in FIGS. 6-8, each coil 612, 712, 713, 812, 813 is depicted as four concentric, hexagonal conductive rings. In other embodiments, the conductive rings comprising a coil may have different shapes, and/or different numbers of concentric rings. In addition, as discussed previously, each coil may be formed using concentric rings within multiple conductive layers (e.g., as depicted in FIGS. 3, 4). In other embodiments, each coil may be formed using concentric rings within a different number of conductive layers from the embodiments depicted in FIGS. 2-4 and 6-8.

Figure 9:
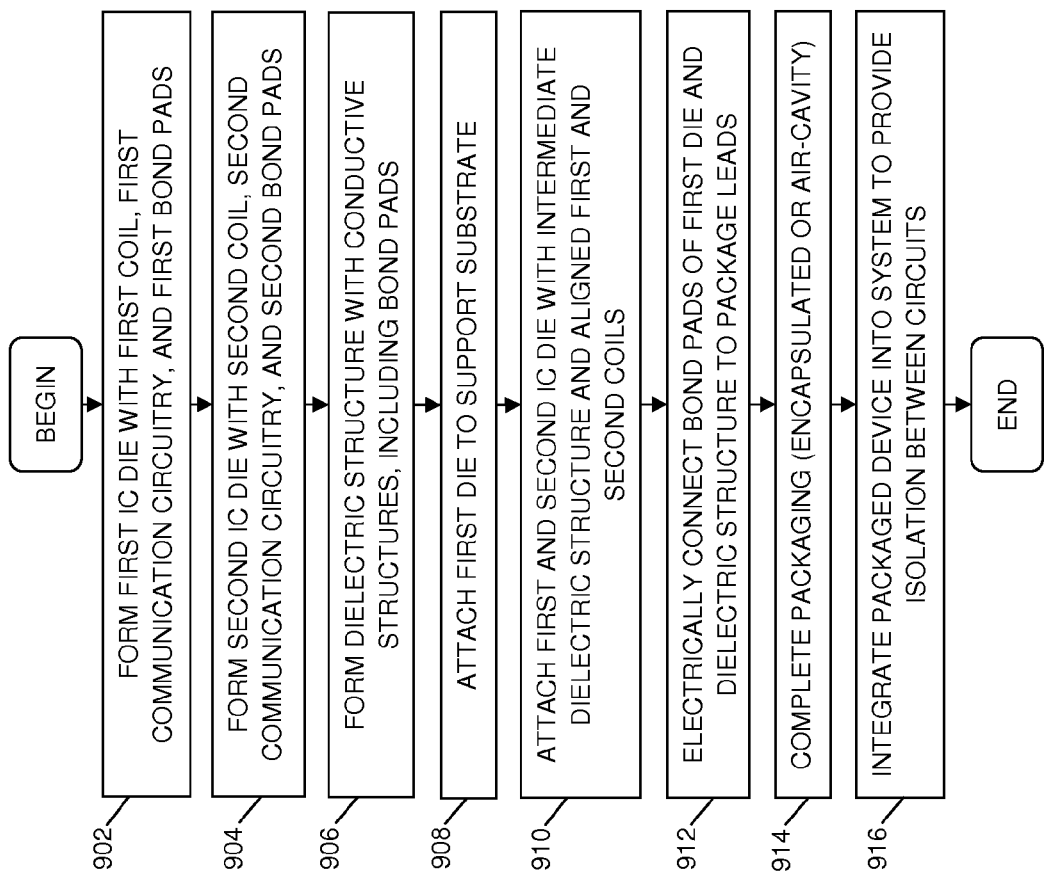
FIG. 9 is a flowchart of a method for manufacturing an inductive communication device, according to an example embodiment.

FIG. 9 is a flowchart of a method for manufacturing IC die (e.g., IC die 210, 230, 300, 400, 610, 630, 710, 730, 810, 830), dielectric structures (e.g., dielectric structures 240, 500, 640, 740, 840), and corresponding inductive communication devices (e.g., device 200, FIG. 2), according to an example embodiment. The method may begin, in blocks 902 and 904, by forming first and second IC die (e.g., IC die 210, 230, 300, 400, 610, 630, 710, 730, 810, 830) for inclusion in the inductive communication device. For example, formation of the first IC die (block 902) may include forming various components associated with one or more instantiations of transmitter, receiver, and/or transceiver circuitry within an integrated circuit substrate (e.g., substrate 302, FIG. 3). In addition, a build-up structure (e.g., structure 310, FIG. 3) may be formed on a top surface of the semiconductor substrate, where the build-up structure includes a plurality of patterned conductive layers (e.g., layers 312, 313, 314, 315, FIG. 3) and dielectric layers (e.g., layers 316, 317, 318, 319, 320, FIG. 3). During formation of the build-up structure, the plurality of conductive layers may be patterned to form conductive traces, and conductive vias may be formed through the dielectric layers between conductive layers to provide for electrical communication between the layers. In addition, during formation of the build-up structure, one or more coils (e.g., coils 212, 340, 612, 712, 713, 812, 813, FIGS. 2, 3 and 6-8), each of which includes multiple substantially-concentric conductive rings may be formed using one or more of the uppermost conductive layers of the build-up structure (e.g., using layers 313-315, FIG. 3). A plurality of bond pads (e.g., bond pads 216, 350, 650, 750, 850, FIGS. 2, 3 and 6-8) may be formed in an uppermost conductive layer to provide for electrical connectivity with the communication circuitry.

Formation of the second IC die may include forming various components associated with one or more instantiations of transmitter, receiver, and/or transceiver circuitry within an integrated circuit substrate (e.g., substrate 402, FIG. 4). According to an embodiment, the second IC die may be formed in a manner that is substantially similar to the manner in which the first IC die is formed, including forming various components associated with one or more instantiations of transmitter, receiver, and/or transceiver circuitry within an integrated circuit substrate (e.g., substrate 402, FIG. 4), and forming a build up structure (e.g., structure 410, FIG. 4) that includes one or more coils (e.g., coils 232, 440, 632, 732, 733, 832, 833, FIGS. 2, 4, and 6-8) and a plurality of bond pads (e.g., bond pads 236, 450, 636, 736, 836, FIGS. 2, 4, and 6-8). In addition, forming the second IC die may include forming one or more additional bond pads (e.g., bond pads 238, 460, 638, 738, 838, FIGS. 2, 4, and 6-8), as previously discussed.

In block 906, a dielectric structure (e.g., dielectric structure 240, 500, 640, 740, 840, FIGS. 2 and 5-8) is formed. In addition, as discussed previously, one or more conductive structures (e.g., conductive structures 245, 545, 645, 745, 845, FIGS. 2 and 5-8) are formed in or on the dielectric structure. Each conductive structure may include a third bond pad (e.g., bond pad 242, 522, 642, 742, 842, FIGS. 2 and 5-8), a fourth bond pad (e.g., bond pad 243, 523, 643, 743, 843, FIGS. 2 and 5-8), and a conductive trace (e.g., conductive trace 244, 524, 644, 744, 844, FIGS. 2 and 5-8) that electrically connects the third and fourth bond pads.

According to an embodiment, in block 908, the first IC die may be attached (e.g., using die attach material) to a support substrate (e.g., support substrate 280, FIG. 2). For example, the support substrate may form a portion of a leadframe that also includes a plurality of leads (e.g., leads 282, 284, FIG. 2).

In block 910, the dielectric structure (e.g., dielectric structure 240, 500, 640, 740, 840, FIGS. 2 and 6-8) may be placed on or affixed to the first IC die so that the dielectric structure substantially covers the portion of the top surface of the first IC die corresponding to the coil(s). The second IC die may then be oriented so that the surface to which its coil(s) are proximate faces the dielectric structure. The coils of the first and second IC die may then be aligned, and the second IC die may be placed on or affixed to the dielectric structure. The corresponding bond pads of the second IC die (e.g., second bond pads 236, 450, 636, 736, 836, FIGS. 2, 4, and 6-8) and the conductive structures (e.g., third bond pads 242, 522, 642, 742, 842, FIGS. 2 and 5-8) may then be electrically connected (e.g., by reflowing solder disposed between the corresponding bond pads). In addition, the additional corresponding bond pads (e.g., bond pads 238, 246, 460, 524, 638, 646, 738, 746, 838, 846, FIGS. 2 and 4-8) may be similarly connected to provide for enhanced mechanical connection between the second IC die and the dielectric structure. Completion of this process may essentially result in one of the assemblies of FIGS. 6-8.

In alternate embodiments, the sub-assembly resulting from the performance of blocks 908 and 910 may be formed differently. For example, while a plurality of first IC die are still in wafer form, a plurality of dielectric structures and second IC die may be aligned with and attached to the plurality of first IC die. The first IC die then may be singlulated from the wafer, and each first IC die (with attached dielectric structure and second IC die) may then be attached to the support structure. The sub-assembly could be similarly formed while a plurality of second IC die are still in wafer form. Other embodiments of fabrication sequences also may be employed to form the sub-assembly, as well.

In block 912, the bond pads of the first IC die may then be electrically coupled to the package leads (e.g., by connecting wirebonds 260 or other types of electrical connections between bond pads 216 and leads 282, FIG. 2), and bond pads of the conductive structures may be electrically coupled to other package leads (e.g., by connecting wirebonds 270 or other types of electrical connections between bond pads 243 and leads 284, FIG. 2). In block 914, packaging of the inductive communication device may then be completed. For example, when the inductive communication device is housed within an overmolded package, a mold may be oriented around the leadframe, and non-conductive encapsulant (e.g., plastic encapsulant) may be dispensed into the mold and cured. Conversely, when the inductive communication device is housed within an air-cavity package, a cap may be attached over the top of the device to establish an air cavity within which the first and second IC are positioned.

In block 916, the packaged inductive communication device may then be integrated into a system in which galvanic isolation between circuits is desired (e.g., system 100, FIG. 1). For example, as discussed previously, embodiments of inductive communication devices described herein may be incorporated into a battery charging system for an HEV, a portion of an AC power isolation system, an isolated gate driver, or other types of system in which galvanic isolation between first and second circuits is desired.

It should be understood that the various method steps illustrated in FIG. 9 may be performed in orders other than the example order illustrated, and/or the method may include more, fewer, or different steps. In addition, certain steps may be collapsed into a single step, and other single steps may be expanded into multiple steps. In addition, certain ones of the method steps may be performed in parallel, rather than serially. Those of skill in the art would understand how to modify the illustrated flowchart in manners that produce substantially the same result. Accordingly, such modifications are intended to be included within the scope of the inventive subject matter.

An embodiment of a device includes a first IC die, a second IC die, a dielectric structure, and a plurality of conductive structures on a surface of the dielectric structure. The first IC die includes a first coil proximate to a first surface of the first IC die, and a plurality of first bond pads proximate to the first surface of the first IC die. The plurality of first bond pads are electrically coupled to the first coil. The second IC die includes a second coil proximate to a first surface of the second IC die, and a plurality of second bond pads proximate to the first surface of the second IC die. The plurality of second bond pads are electrically coupled to the second coil. The first IC die and the second IC die are arranged within the device so that the first surface of the first IC die faces the first surface of the second IC die, and the first coil and the second coil are aligned with each other across a gap between the first IC die and the second IC die. The first IC die and the second IC die are galvanically isolated from each other. The dielectric structure is positioned within the gap, and the dielectric structure has a first surface and an opposing second surface. The first surface of the dielectric structure faces the first surface of the first IC die, the second surface of the dielectric structure faces the first surface of the second IC die, and the dielectric structure includes a portion that extends beyond a lateral extent of the second IC die. The plurality of conductive structures are on the second surface of the dielectric structure. First ends of the plurality of conductive structures are aligned with and electrically coupled with the second bond pads, and second ends of the plurality of conductive structures are configured to function as a plurality of third bond pads.

An embodiment of an inductive communication method includes providing a first signal to a first coil of a first IC die, where the first coil is proximate to a first surface of the first IC die, and the first coil converts the first signal into a time-varying magnetic field around the first coil. The method further includes receiving a second signal by a second coil of a second IC die as a result of the time-varying magnetic field coupling with the second coil. The second coil is proximate to a first surface of the second IC die, and the first IC die and the second IC die are arranged within an integrated circuit package so that the first surface of the first IC die faces the first surface of the second IC die, and the first coil and the second coil are aligned with each other across a gap between the first IC die and the second IC die so that the first IC die and the second IC die are galvanically isolated from each other.

An embodiment of a method of manufacturing an inductive communication device includes coupling together a first integrated circuit (IC) die, a dielectric structure, and a second IC die. The first IC die includes a first coil proximate to a first surface of the first IC die, and a plurality of first bond pads proximate to the first surface of the first IC die. The plurality of first bond pads are electrically coupled to the first coil. The second IC die includes a second coil proximate to a first surface of the second IC die, and a plurality of second bond pads proximate to the first surface of the second IC die. The plurality of second bond pads are electrically coupled to the second coil. The first IC die and the second IC die are arranged within the device so that the first surface of the first IC die faces the first surface of the second IC die, and the first coil and the second coil are aligned with each other across a gap between the first IC die and the second IC die. The first IC die and the second IC die are galvanically isolated from each other. The dielectric structure is positioned within the gap, and the dielectric structure has a first surface and an opposing second surface. The first surface of the dielectric structure faces the first surface of the first IC die, the second surface of the dielectric structure faces the first surface of the second IC die, and the dielectric structure includes a portion that extends beyond a lateral extent of the second IC die. A plurality of conductive structures are positioned on the second surface of the dielectric structure. First ends of the plurality of conductive structures are aligned with and electrically coupled with the second bond pads, and second ends of the plurality of conductive structures are configured to function as a plurality of third bond pads. The method further includes electrically connecting the plurality of first bond pads to first package leads, and electrically connecting the plurality of third bond pads to second package leads.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

For simplicity and clarity of illustration, the drawing figures illustrate the general manner of construction, and descriptions and details of well-known features and techniques may be omitted to avoid unnecessarily obscuring the description of the embodiments. Additionally, elements in the drawings figures are not necessarily drawn to scale. For example, the dimensions of some of the elements or regions in some of the figures may be exaggerated relative to other elements or regions of the same or other figures to help improve understanding of the various embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," right," "in," "out," "front," "back," "up," "down, "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A device comprising:
   a first integrated circuit (IC) die that includes a first coil proximate to a first surface of the first IC die, and a plurality of first bond pads proximate to the first surface of the first IC die, wherein the plurality of first bond pads are electrically coupled to the first coil;
   a second IC die that includes a second coil proximate to a first surface of the second IC die, and a plurality of second bond pads proximate to the first surface of the second IC die, wherein the plurality of second bond pads are electrically coupled to the second coil, wherein the first IC die and the second IC die are arranged within the device so that the first surface of the first IC die faces the first surface of the second IC die, and the first coil and the second coil are aligned with each other across a gap between the first IC die and the second IC die, and wherein the first IC die and the second IC die are galvanically isolated from each other;
   a dielectric structure within the gap, wherein the dielectric structure has a first surface and an opposing second surface, wherein the first surface of the dielectric structure faces the first surface of the first IC die, the second surface of the dielectric structure faces the first surface of the second IC die, and the dielectric structure includes a portion that extends beyond a lateral extent of the second IC die; and
   a plurality of conductive structures on the second surface of the dielectric structure, wherein first ends of the plurality of conductive structures are aligned with and electrically coupled with the second bond pads, and second ends of the plurality of conductive structures are configured to function as a plurality of third bond pads.

2. The device of claim 1, wherein the plurality of conductive structures include a plurality of conductive traces formed on the second surface of the dielectric structure.

3. The device of claim 1, further comprising:
   first electrical connections coupled to the first bond pads; and
   second electrical connections coupled to the third bond pads, and
   wherein the first electrical connections and the second electrical connections are selected from wirebonds, solder bumps, stud bumps, and direct chip attach structures.

4. The device of claim 3, further comprising:
   a plurality of package leads, wherein the first electrical connections are coupled between the first bond pads and a first set of the package leads, and the second electrical connections are coupled between the third bond pads and a second set of the package leads.

5. The device of claim 4, further comprising:
   a support structure, wherein a second surface of the first IC die is coupled to the support structure, and wherein the support structure and the plurality of package leads form portions of a leadframe.

6. The device of claim 1, wherein:
   the first coil is formed from a plurality of first patterned conductors in a plurality of first metal layers that are separated by one or more first dielectric layers; and
   the second coil is formed from a plurality of second patterned conductors in a plurality of second metal layers that are separated by one or more second dielectric layers.

7. The device of claim 1, wherein:
   the first IC die further includes transmitter circuitry coupled to the first coil; and
   the second IC die further includes receiver circuitry coupled to the second coil.

8. The device of claim 1, wherein the dielectric structure includes a dielectric material with a thickness in a range of about 20 micrometers to about 400 micrometers.

9. The device of claim 1, wherein:
   the first IC die further includes one or more additional first coils proximate to the first surface of the first IC die;
   the second IC die further includes one or more additional second coils proximate to the first surface of the second IC die, wherein each of the additional first coils is aligned with a corresponding one of the additional second coils across the gap; and the dielectric structure is positioned within the gap directly between aligned pairs of the additional first coils and the additional second coils.

10. The device of claim 1, wherein the first IC die, the second IC die, and the one or more dielectric components are packaged together in an air-cavity package.

11. The device of claim 1, wherein the first IC die, the second IC die, and the one or more dielectric components are packaged together in an overmolded package.

12. A method of manufacturing an inductive communication device, the method comprising the steps of:
  coupling together a first integrated circuit (IC) die, a dielectric structure, and a second IC die, wherein
    the first IC die includes a first coil proximate to a first surface of the first IC die, and a plurality of first bond pads proximate to the first surface of the first IC die, wherein the plurality of first bond pads are electrically coupled to the first coil,
    the second IC die includes a second coil proximate to a first surface of the second IC die, and a plurality of second bond pads proximate to the first surface of the second IC die, wherein the plurality of second bond pads are electrically coupled to the second coil,
    the first IC die and the second IC die are arranged within the device so that the first surface of the first IC die faces the first surface of the second IC die, and the first coil and the second coil are aligned with each other across a gap between the first IC die and the second IC die,
    the first IC die and the second IC die are galvanically isolated from each other,
    the dielectric structure is positioned within the gap, and the dielectric structure has a first surface and an opposing second surface, wherein the first surface of the dielectric structure faces the first surface of the first IC die, the second surface of the dielectric structure faces the first surface of the second IC die, and the dielectric structure includes a portion that extends beyond a lateral extent of the second IC die, and
    a plurality of conductive structures are positioned on the second surface of the dielectric structure, wherein first ends of the plurality of conductive structures are aligned with and electrically coupled with the second bond pads, and second ends of the plurality of conductive structures are configured to function as a plurality of third bond pads;
  electrically connecting the plurality of first bond pads to first package leads; and
  electrically connecting the plurality of third bond pads to second package leads.

13. The method of claim 12, further comprising:
  forming the first IC die by forming, over the first semiconductor substrate, a plurality of first patterned conductive layers, wherein the first coil is formed from multiple substantially-concentric first conductive rings of the first patterned conductive layers and first conductive vias between the first patterned conductive layers; and
  forming the second IC die by forming, over the second semiconductor substrate, a plurality of second patterned conductive layers, wherein the second coil is formed from multiple substantially-concentric second conductive rings of the second patterned conductive layers and second conductive vias between the second patterned conductive layers.

14. The method of claim 13, wherein:
  forming the first IC die further comprises forming first communication circuitry between the plurality of first bond pads and the first coil; and
  forming the second IC die further comprises forming second communication circuitry between the plurality of second bond pads and the second coil.

15. The method of claim 12, wherein:
  the plurality of first bond pads are electrically connected to the first package leads with a first plurality of electrical connections; and
  the plurality of third bond pads are electrically connected to the second package leads with a second plurality of electrical connections, and
  wherein the first electrical connections and the second electrical connections are selected from wirebonds, solder bumps, stud bumps, and direct chip attach structures.

* * * * *